United States Patent
Zhou et al.

(10) Patent No.: US 7,403,129 B2
(45) Date of Patent: Jul. 22, 2008

(54) ELECTRICAL SWITCHING APPARATUS AND METHOD EMPLOYING ACOUSTIC AND CURRENT SIGNALS TO DISTINGUISH BETWEEN PARALLEL AND SERIES ARC FAULTS

(75) Inventors: Xin Zhou, Franklin Park, PA (US);
Jerome K. Hastings, Sussex, WI (US);
Joseph C. Zuercher, Brookfield, WI (US)

(73) Assignee: Eaton Corporation, Cleveland, OH (US)

( * ) Notice: Subject to any disclaimer, the term of this patent is extended or adjusted under 35 U.S.C. 154(b) by 245 days.

(21) Appl. No.: 11/431,332

(22) Filed: May 10, 2006

(65) Prior Publication Data

US 2007/0263329 A1    Nov. 15, 2007

(51) Int. Cl.
*G08B 21/00* (2006.01)

(52) U.S. Cl. ............. 340/635; 340/636.12; 340/636.17; 340/638; 340/644; 340/650; 340/652; 340/664; 324/527; 324/528; 324/529; 361/42; 361/93.2

(58) Field of Classification Search ................. 340/635, 340/636.12, 636.13, 636.17, 638, 644, 650, 340/652, 664; 324/527, 528, 529; 361/42, 361/93.2
See application file for complete search history.

(56) References Cited

U.S. PATENT DOCUMENTS

| | | | |
|---|---|---|---|
| 3,892,920 A * | 7/1975 | Kolm | ......................... 367/197 |
| 4,165,482 A | 8/1979 | Gale | |
| 4,316,139 A | 2/1982 | Root | |
| 5,224,006 A | 6/1993 | MacKenzie et al. | |
| 5,341,191 A | 8/1994 | Crookston et al. | |
| 5,352,984 A | 10/1994 | Piesinger | |
| 5,493,618 A * | 2/1996 | Stevens et al. | ............... 381/110 |
| 5,521,840 A | 5/1996 | Bednar | |
| 5,608,328 A | 3/1997 | Sanderson | |
| 5,691,869 A | 11/1997 | Engel et al. | |
| 5,805,399 A | 9/1998 | Pacholok | |
| 6,215,408 B1 | 4/2001 | Leonard et al. | |
| 6,522,228 B2 | 2/2003 | Wellner et al. | |
| 6,522,509 B1 | 2/2003 | Engel et al. | |
| 6,542,056 B2 | 4/2003 | Nerstrom et al. | |

(Continued)

OTHER PUBLICATIONS

Innovative Dynamics, Inc., "Wire Chafing Sensor", http://www.idiny.com/chafing.html, 2004, 3 pp.

(Continued)

*Primary Examiner*—Tai T Nguyen
(74) *Attorney, Agent, or Firm*—Martin J. Moran

(57) ABSTRACT

A circuit breaker includes a first lug and second and third acoustic lugs electrically connected to a power circuit. Separable contacts are electrically connected in series between the first lug and the second acoustic lug. An operating mechanism opens and closes the separable contacts. A first acoustic sensor is coupled to the second acoustic lug and senses a first acoustic signal from the second acoustic lug. A second acoustic sensor is coupled to the third acoustic lug and senses a second acoustic signal from the third acoustic lug. The first and second acoustic signals are operatively associated with a power circuit fault. A current sensor senses a current flowing between the first and second lugs. A circuit inputs the sensed acoustic signals and the sensed current and detects and distinguishes a parallel arc fault or a series arc fault from the sensed acoustic signals and the sensed current.

26 Claims, 4 Drawing Sheets

U.S. PATENT DOCUMENTS

| | | |
|---|---|---|
| 6,625,550 B1 | 9/2003 | Scott et al. |
| 6,707,652 B2 | 3/2004 | Engel |
| 6,710,688 B2 | 3/2004 | Wellner et al. |
| 6,720,872 B1 | 4/2004 | Engel et al. |
| 6,734,682 B2 | 5/2004 | Tallman et al. |
| 6,777,953 B2 | 8/2004 | Blades |
| 6,798,211 B1 | 9/2004 | Rockwell et al. |
| 2002/0038199 A1 | 3/2002 | Blemel |
| 2002/0130668 A1 | 9/2002 | Blades |
| 2003/0037615 A1 | 2/2003 | Madaras et al. |
| 2003/0201780 A1 | 10/2003 | Blades |
| 2004/0027749 A1 | 2/2004 | Zuercher et al. |
| 2005/0017731 A1 | 1/2005 | Zuercher et al. |

OTHER PUBLICATIONS

Maroni, C.-S. et al., "Series Arc Detection in Low Voltage Distribution Switchboard Using Spectral Analysis", International Symposium on Signal Processing and its Applications (ISSPA), 2001, pp. 473-476.

* cited by examiner

ELECTRICAL SWITCHING APPARATUS AND METHOD EMPLOYING ACOUSTIC AND CURRENT SIGNALS TO DISTINGUISH BETWEEN PARALLEL AND SERIES ARC FAULTS

BACKGROUND OF THE INVENTION

1. Field of the Invention

This invention relates to electrical switching apparatus and, more particularly, to circuit interrupters, such as, for example, circuit breakers providing fault protection. The invention also relates to methods for detecting faults, such as arc faults.

2. Background Information

Electrical switching apparatus include, for example, circuit switching devices and circuit interrupters such as circuit breakers, receptacles, contactors, motor starters, motor controllers and other load controllers.

Circuit breaker technology is well-known in the art. An example of a circuit breaker is disclosed in U.S. Pat. No. 5,341,191. Circuit breakers are used to protect electrical circuitry from damage due to an overcurrent condition, such as an overload condition or a high level short circuit condition. Molded case circuit breakers, for example, include at least one pair of separable contacts which are operated manually by way of a handle disposed on the outside of the case or automatically by way of an internal trip unit in response to an overcurrent condition. In small circuit breakers used in load centers commonly found in residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected circuit.

Arcing is a luminous discharge of electricity across an insulating medium, usually accompanied by the partial volatilization of electrodes. An arc fault is an unintentional arcing condition in an electrical circuit. Arc faults can be caused, for instance, by worn insulation between adjacent bared conductors, by exposed ends between broken conductors, by faulty electrical connections, and in other situations where conducting elements are in close proximity. Arc faults in systems can be intermittent since the magnetic repulsion forces generated by the arc current force the conductors apart to extinguish the arc. Mechanical forces then bring the conductors together again in order that another arc is struck.

During sporadic arc fault conditions, the overload capability of the circuit breaker will not function since the root-mean-squared (RMS) value of the fault current is too small to activate the automatic trip circuit. The addition of electronic arc fault sensing to a circuit breaker adds one of the elements required for sputtering arc fault protection—ideally, the output of an electronic arc fault sensing circuit directly trips and, thus, opens the circuit breaker. See, for example, U.S. Pat. Nos. 6,710,688; 6,542,056; 6,522,509; 6,522,228; 5,691,869; and 5,224,006, which deal with DC and AC arc fault detection. See, also, U.S. Pat. No. 6,720,872, which deals with a receptacle.

Known technology for arc fault detection may employ a current signature. The problems associated with this methodology include false arc fault current signature detection from some electrical loads. Also, there are variations in the arc fault that depend on how the arc fault is created including, for example, its immediate environment.

U.S. Pat. No. 5,608,328 discloses as background information that widespread methods for precisely locating faults in power cables are based on acoustic detection of an arc at the fault. Typically, a surge generator or "thumper" is used to excite the power cable with a series of high-energy pulses which, in turn, prompt audible sparking and vibration at the fault.

U.S. Pat. No. 5,608,328 further discloses that a series arc, once formed, tends to grow in length by reason of the thermal and electrochemical action of the arc. The arc literally erodes the adjacent contacts thereby assuring, absent human intervention, that the once marginal "opening" will become a full-fledged gap. This gap will continue to sustain an arc for hours or even months until it grows beyond an arc-sustaining maximum. During such periods, electrical and acoustic noise will be produced by the arc. Further, substantial energy will be generated by reason of the volt-amp product associated with the gap/arc which must be dissipated in order to maintain temperatures within safe limits. The arc is detected by detectors that receive electrical radio frequency (RF) noise.

U.S. Pat. No. 6,734,682 discloses a portable arc fault locating and testing device that employs an ultrasonic pick-up coil and an ultrasonic detector in combination with an audible pick-up coil and an audible detector. A circuit determines the correlation between the ultrasonic sound and the audible sound characteristics of an arc fault.

U.S. Pat. No. 6,777,953 discloses a system for locating parallel arcing faults in a set of wires. The system includes a handheld ultrasonic monitor to measure and indicate the distance from the operator to the arc. It measures both the electromagnetic pulse from the arc and the ultrasonic emission from the arc and uses the difference in arrival times to calculate the distance to the arc.

U.S. Pat. No. 6,798,211 discloses a fault distance indicator that locates a fault in a power line by modeling pulses of reflected traveling wave signals which are generated from electrical arcs that occur as a result of the fault. The fault distance indicator is mounted directly on a power line within a transformer enclosure, is powered by a power signal obtained from a transformer secondary and includes a transceiver, such as an infrared transceiver, although radio frequency or ultrasonic transceivers may be used.

U.S. Patent Application Publication No. 2003/0037615 discloses the generation and detection of acoustic guided waves to evaluate the condition of insulation on electrical wiring. For example, suitable transmitter and receiver transducers are broadband acoustic emission piezoelectric transducers.

The web site at http://www.idiny.com/chafing.html states that a wire chafing sensor is a passive solution to the problem of wire chafing detection by listening to noise signatures in the wire. This also states that the system can detect wire chafing, arcing and burning, and that pattern recognition software categorizes degrees of chafing.

U.S. Patent Application Publication No. 2005/0017731 discloses an apparatus for distinguishing a parallel arc from a series arc. The apparatus measures a value of current flowing in a power circuit, identifies the parallel arc when the measured value of current is greater than a nominal value of current, and identifies the series arc when the measured value of current is less than the nominal value of current.

There is room for improvement in electrical switching apparatus, such as, for example, arc fault circuit breakers and receptacles, and in methods for detecting arc faults.

SUMMARY OF THE INVENTION

These needs and others are met by embodiments of the invention, which employ two acoustic signals and one current signal to distinguish between parallel and series arc faults. Two acoustic sensors are coupled to acoustic lugs, which are electrically connected to a power circuit. The acoustic sensors "listen" directly to noise generated by a fault, no matter what type of electrical load is present or in what kind of environment in which the fault is generated. The acoustic noise generated by an arc fault has an acoustic signal at one or more specific wavelengths that is (are) directly related to either the basic characteristics of, for example, the arc and its resonance frequency or, if applicable, the alternating current power source modulated frequency and its harmonics.

In accordance with one aspect of the invention, an electrical switching apparatus for detecting and distinguishing a fault of a power circuit comprises: a first lug; a second acoustic lug structured to be electrically connected to the power circuit; a third acoustic lug structured to be electrically connected to the power circuit; separable contacts electrically connected in series between the first lug and the second acoustic lug; an operating mechanism structured to open and close the separable contacts; a first acoustic sensor coupled to the second acoustic lug, the first acoustic sensor being structured to sense a first acoustic signal from the second acoustic lug, the first acoustic signal being operatively associated with the fault of the power circuit; a second acoustic sensor coupled to the third acoustic lug, the second acoustic sensor being structured to sense a second acoustic signal from the third acoustic lug, the second acoustic signal being operatively associated with the fault of the power circuit; a third current sensor structured to sense a current flowing between the first lug and the second acoustic lug; and a circuit inputting the first and second sensed acoustic signals and the sensed current, the circuit structured to detect and distinguish a parallel arc fault or a series arc fault from the first and second sensed acoustic signals and the sensed current.

The circuit may be further structured to determine if the difference between the magnitudes of the first and second sensed acoustic signals is greater than a predetermined amount or if the difference between the time of receipt of the first and second sensed acoustic signals is greater than a predetermined time, and if the magnitude of the sensed current confirms the fault to be a series arc fault.

The circuit may be further structured to determine if the difference between the magnitudes of the first and second sensed acoustic signals is less than a predetermined amount or if the difference between the time of receipt of the first and second sensed acoustic signals is less than a predetermined time, and if the magnitude of the sensed current confirms the fault to be a parallel arc fault.

As another aspect of the invention, a method of distinguishing a fault in a power circuit comprises: employing a first acoustic lug structured to be electrically connected to the power circuit; employing a second acoustic lug structured to be electrically connected to the power circuit; coupling a first acoustic sensor to the first acoustic lug; coupling a second acoustic sensor to the second acoustic lug; sensing a first acoustic signal from the first acoustic lug with the first acoustic sensor, the first acoustic signal being operatively associated with the fault of the power circuit; sensing a second acoustic signal from the second acoustic lug with the second acoustic sensor, the second acoustic signal being operatively associated with the fault of the power circuit; sensing a current flowing between the first acoustic lug and the power circuit; inputting the first and second sensed acoustic signals and the sensed current and distinguishing a parallel arc fault or a series arc fault from the first and second sensed acoustic signals and the sensed current.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the term "acoustic" shall expressly include, but not be limited by, one or more sounds that are subsonic, sonic and/or ultrasonic.

As employed herein, the term "lug" shall expressly include, but not be limited by, a terminal or other electrically conductive fitting to which one or more electrical wires or other electrical conductors are electrically and mechanically connected.

The invention is described in association with an arc fault circuit breaker, although the invention is applicable to a wide range of electrical switching apparatus.

Figure 1:
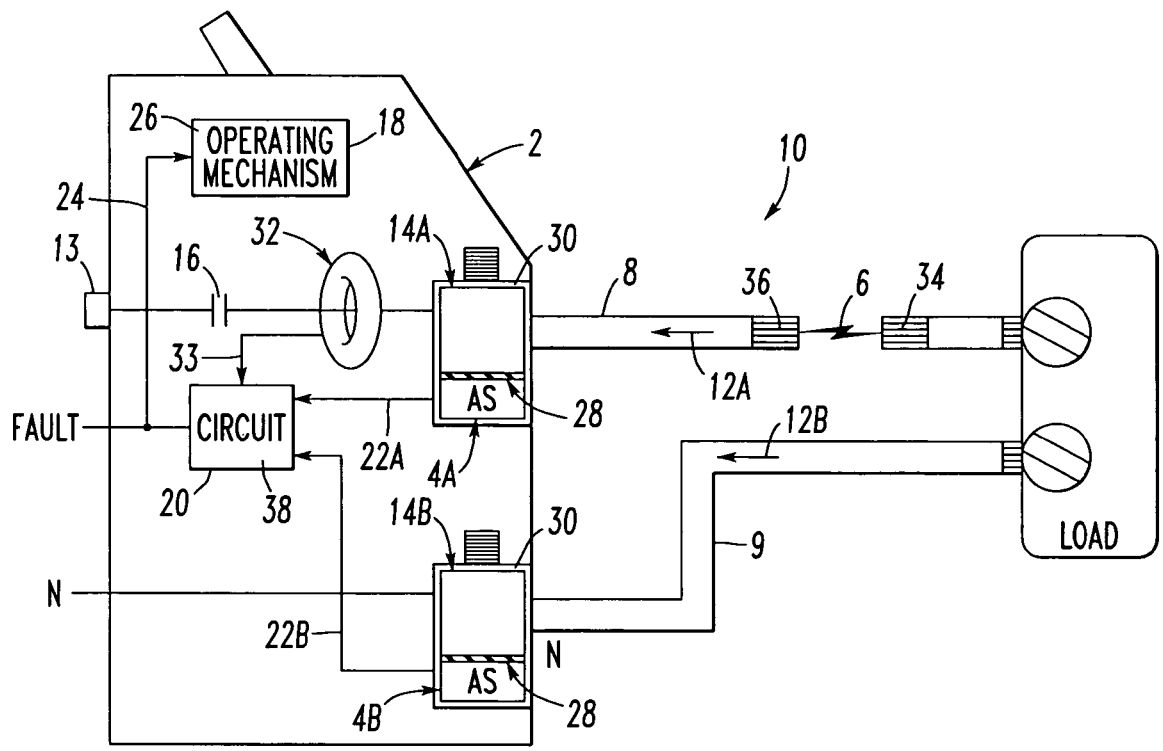
FIG. 1 is a block diagram of a circuit breaker employing acoustic sensors and a current sensor to detect and distinguish a series arc fault condition in accordance with an embodiment of the invention.

FIG. 1 shows an electrical switching apparatus, such as a circuit breaker 2, employing suitable acoustic sensors 4A,4B, such as piezo electrical sensors, and a current sensor 32 to detect and distinguish a fault, such as a series arc fault condition 6, in an electrical conductor 8 of a power circuit 10. Here, electrical conductor-conducted acoustic signals 12A, 12B from the series arc fault condition 6 are sensed by the respective acoustic sensors 4A,4B, in order to detect and distinguish the series arc fault condition 6 or a parallel arc fault condition 6' (FIG. 2), as will be described. The acoustic signals 12A,12B are operatively associated with the power circuit series arc fault condition 6.

As shown, the acoustic sensors 4A,4B are suitably coupled to respective electrical conductors 8,9 in order to "listen" for conducted sound. The circuit breaker 2 includes a first lug, such as a line terminal 13, a second acoustic lug 14A, such as a load terminal, and a third acoustic lug 14B, such as a load-neutral terminal. The second and third acoustic lugs 14A,14B are structured to be electrically connected to the respective power circuit electrical conductors 8,9, as shown. In this example, the power circuit 10 includes the load conductor 8 and the load-neutral conductor 9. The second acoustic lug 14A is structured to be electrically connected to the load conductor 8, and the third acoustic lug 14B is structured to be electrically connected to the load-neutral conductor 9.

The circuit breaker 2 also includes separable contacts 16 electrically connected in series between the line terminal 13 and the acoustic lug 14A, and an operating mechanism 18 structured to open and close the separable contacts 16. The acoustic sensors 4A,4B are suitably coupled to the acoustic lugs 14A,14B and are structured to sense the acoustic signals 12A,12B from the acoustic lugs 14A,14B, respectively. The circuit breaker 2 further includes a circuit 20 inputting sensed acoustic signals 22A,22B from the respective acoustic sensors 4A,4B and a sensed current signal 33 from the current sensor 32. The circuit 20 is structured to output a detected fault signal 24 therefrom, as will be described. The current sensor 32 is structured to sense a current flowing between the first lug 13 and the second acoustic lug 14A and output the sensed current signal 33. In accordance with an important aspect of the invention, the circuit 20 inputs the first and second sensed acoustic signals 22A,22B and the sensed current signal 33 and detects and distinguishes the parallel arc fault condition 6' (FIG. 2) and/or the series arc fault condition 6 (FIG. 1) from the first and second sensed acoustic signals and the sensed current signal.

The current sensor 32 is discussed below in connection with FIGS. 3A-3B. The current sensor 32 is employed, for example, to identify electric power source frequency when the power circuit 10 is an alternating current (AC) power circuit and, together with the acoustic sensors 4A,4B, to detect the arc fault conditions 6,6'.

As will be discussed below in connection with FIGS. 3A-3B, for the series arc fault condition 6 (FIG. 1), the circuit 20 determines if the difference between the magnitudes of the first and second sensed acoustic signals 12A,12B is greater than a predetermined amount and if the difference between the time of receipt of the first and second sensed acoustic signals 12A,12B is greater than a predetermined time, and if the magnitude of the sensed current signal 33 indicates a series arc fault (e.g., this magnitude may step down to a lower magnitude as a result of the series arc fault condition 6).

As will be discussed below in connection with FIGS. 3A-3B, for the parallel arc fault condition 6' (FIG. 2), the circuit 20 determines if the difference between the magnitudes of the first and second sensed acoustic signals 12A,12B is less than a predetermined amount (e.g., these magnitudes are about the same) and if the difference between the time of receipt of the first and second sensed acoustic signals 12A, 12B is less than a predetermined time (e.g., these times are about the same), and if the magnitude of the sensed current signal 33 indicates a parallel arc fault (e.g., this magnitude may step up to a higher magnitude as a result of the parallel arc fault condition 6'). Almost without exception (e.g., current could decrease when a pair of conductors (e.g., load and neutral conductors) are cut by metal blades), current increases for a parallel arc.

Figure 2:
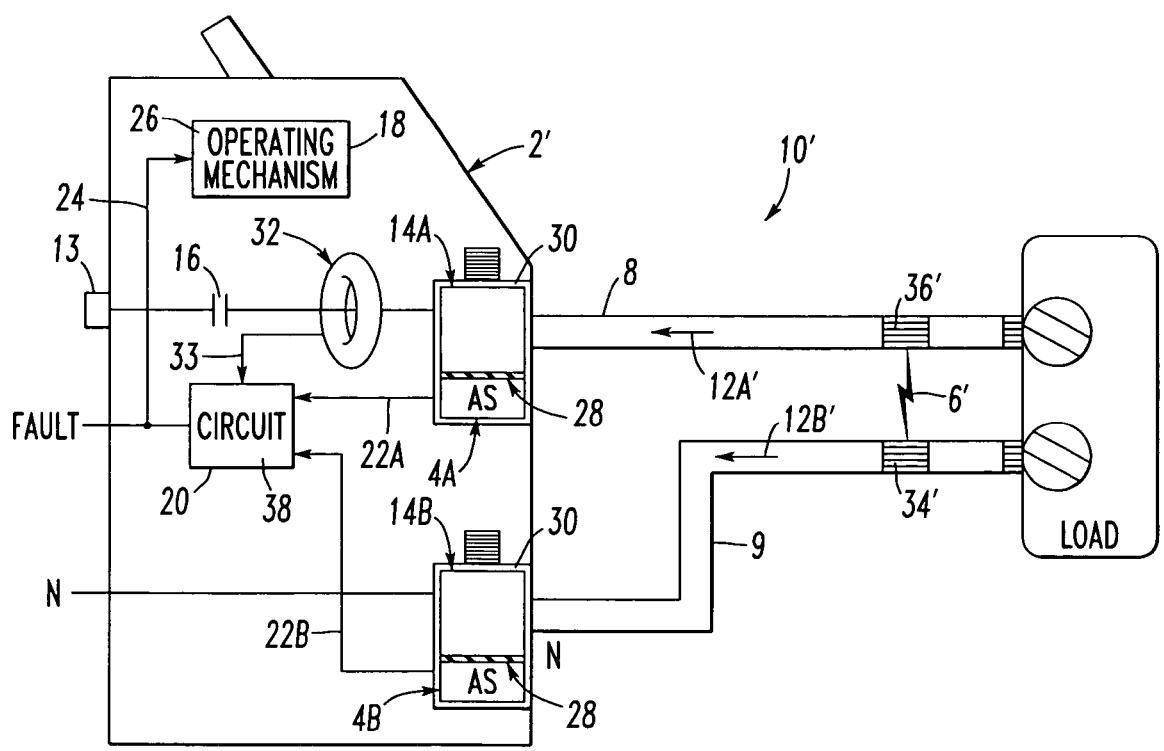
FIG. 2 is a block diagram of a circuit breaker employing acoustic sensors and a current sensor to detect and distinguish a parallel arc fault condition in accordance with another embodiment of the invention.

As will be discussed below in connection with FIGS. 3A-3B, the circuit 20 includes a display 38 structured to display (e.g., without limitation, indicate the occurrence of) the series arc fault condition 6 (FIG. 1) or the parallel arc fault condition 6' (FIG. 2).

Although the example power circuit 10 includes a load-neutral conductor 9 (N), the invention is applicable to power circuits which employ two or more conductors (e.g., without limitation, first and second phases) and to electrical switching apparatus that receive two or more load conductors.

EXAMPLE 1

The circuit breaker 2 may be, for example, an arc fault circuit interrupter. The operating mechanism 18 may include a trip mechanism 26, and the circuit 20 may output the detected fault signal 24 as a trip signal to the trip mechanism 26 upon detecting the arc fault condition 6 from the sensed acoustic signals 22A,22B and from the sensed current signal 33.

EXAMPLE 2

The example acoustic lugs 14A,14B are preferably structured to match the acoustic wave-guide provided by the respective electrical conductors 8,9. The acoustic lugs 14A, 14B preferably include suitable acoustic wave-guide properties that couple the acoustic signals 12A,12B from the power circuit 10 to the acoustic sensors 4A,4B, respectively.

EXAMPLE 3

The acoustic lug 14A includes a voltage (e.g., a line voltage from the terminal 13) structured to be electrically output to the power circuit 10. Since the load-neutral conductor 9 is normally only grounded upstream (e.g., without limitation, at a load center or panel board (not shown)) of the circuit breaker 2, it may have a nominal voltage. The acoustic lugs 14A,14B preferably include a suitable electrical insulator 28 (e.g., a relatively thin insulating polymer or ceramic) structured to electrically insulate the acoustic sensors 4A,4B from the respective conductors 8,9 and the corresponding voltages thereof.

EXAMPLE 4

The acoustic lugs 14A,14B preferably include a suitable acoustic insulator 30 (e.g., without limitation, an acoustic insulation foam pad wrapped around the corresponding acoustic lug 14A,14B and the corresponding acoustic sensor 4A,4B), such as a suitable mount and suitable acoustic insulation, structured to insulate the acoustic sensors 4A,4B from airborne noise.

EXAMPLE 5

The circuit breaker 2 measures the acoustic signal (e.g., without limitation, acoustic signature) generated by a fault, such as the series arc fault condition 6 of FIG. 1, to detect the same. This acoustic sensing technique will generally not experience a false output due to electrical current, since, fortunately, the current flowing through a solid electrical conductor and electrical connections or terminations does not produce an acoustic output. Rather, the acoustic sensors 4A,4B "listen" directly to mechanical noise generated by an electrical fault, such as the series arc fault condition 6.

EXAMPLE 6

Noise resulting from on/off power switching is generally of relatively short duration and has a specific "shape," due to a relatively short switching time and, also, due to mechanical bounce. Acoustic noise activity at the initiation of the arc fault, such as the series arc fault condition 6, is due, in part, to mechanical separation of electrical contacts 34,36 in the broken conductor 8 and, thus, is preferably considered to be insufficient to indicate a trip with the detected fault signal 24.

FIG. 2 is a block diagram of a circuit breaker 2', which is the same as or similar to the circuit breaker 2 of FIG. 1. The circuit breaker 2' provides parallel arc fault detection and employs the acoustic sensors 4A,4B to receive respective acoustic signals 12A',12B' and the current sensor 32, in order to detect the parallel arc fault condition 6' between electrical contacts 34',36' arising from, for example, worn or broken insulation (not shown) of the power circuit 10'. Otherwise, there need be no difference in the structure of the circuit breakers 2,2' of FIGS. 1 and 2 for series and parallel, respectively, arc fault detection, or the algorithm 40 of FIGS. 3A-3B for distinguishing between series and parallel arc faults.

Figure 3A:
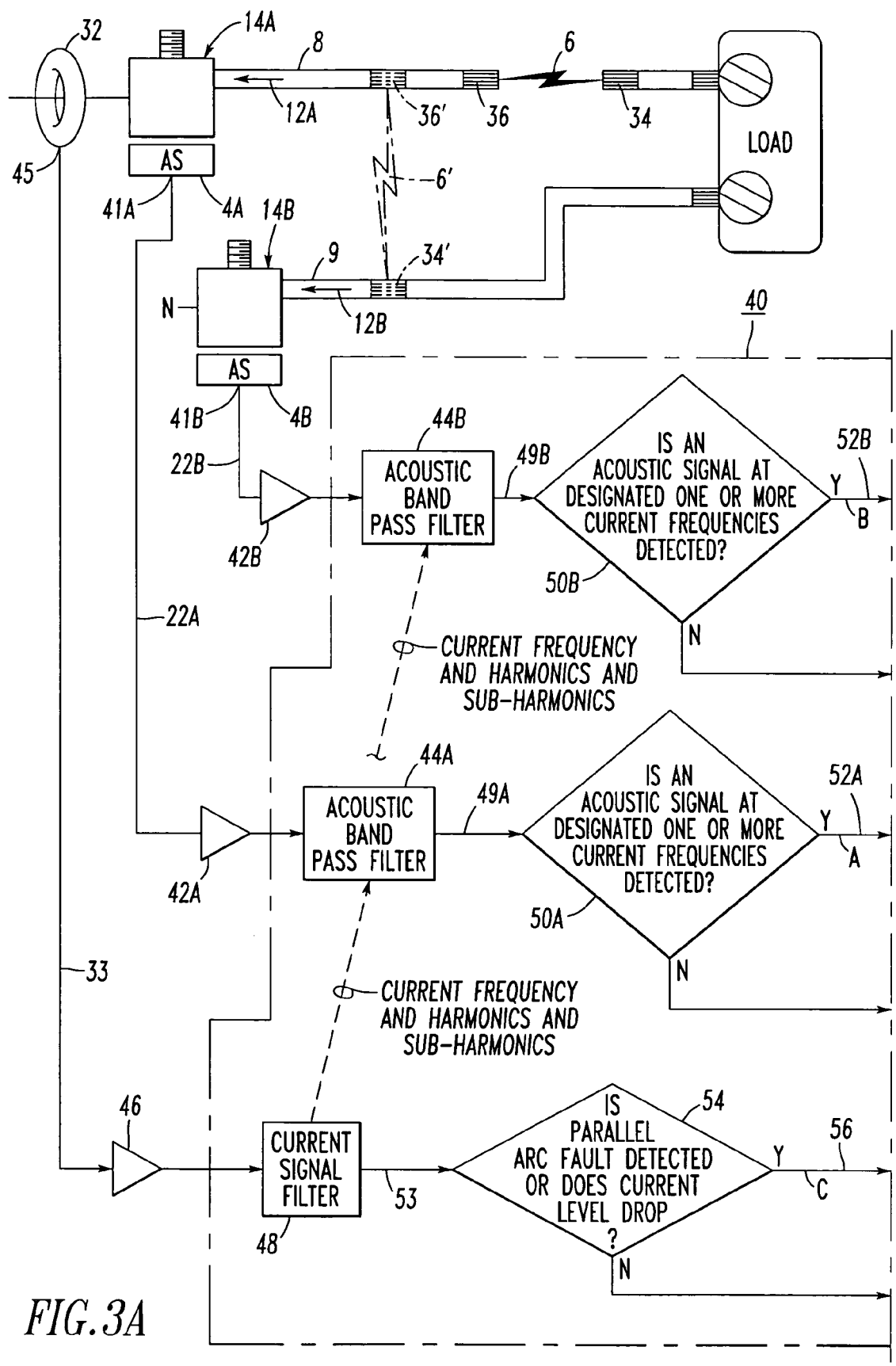
FIGS. 3A-3B form a flowchart of an arc fault detection algorithm suitable for use by the circuit breakers of FIGS. 1 or 2 in accordance with another embodiment of the invention.
Figure 3B:
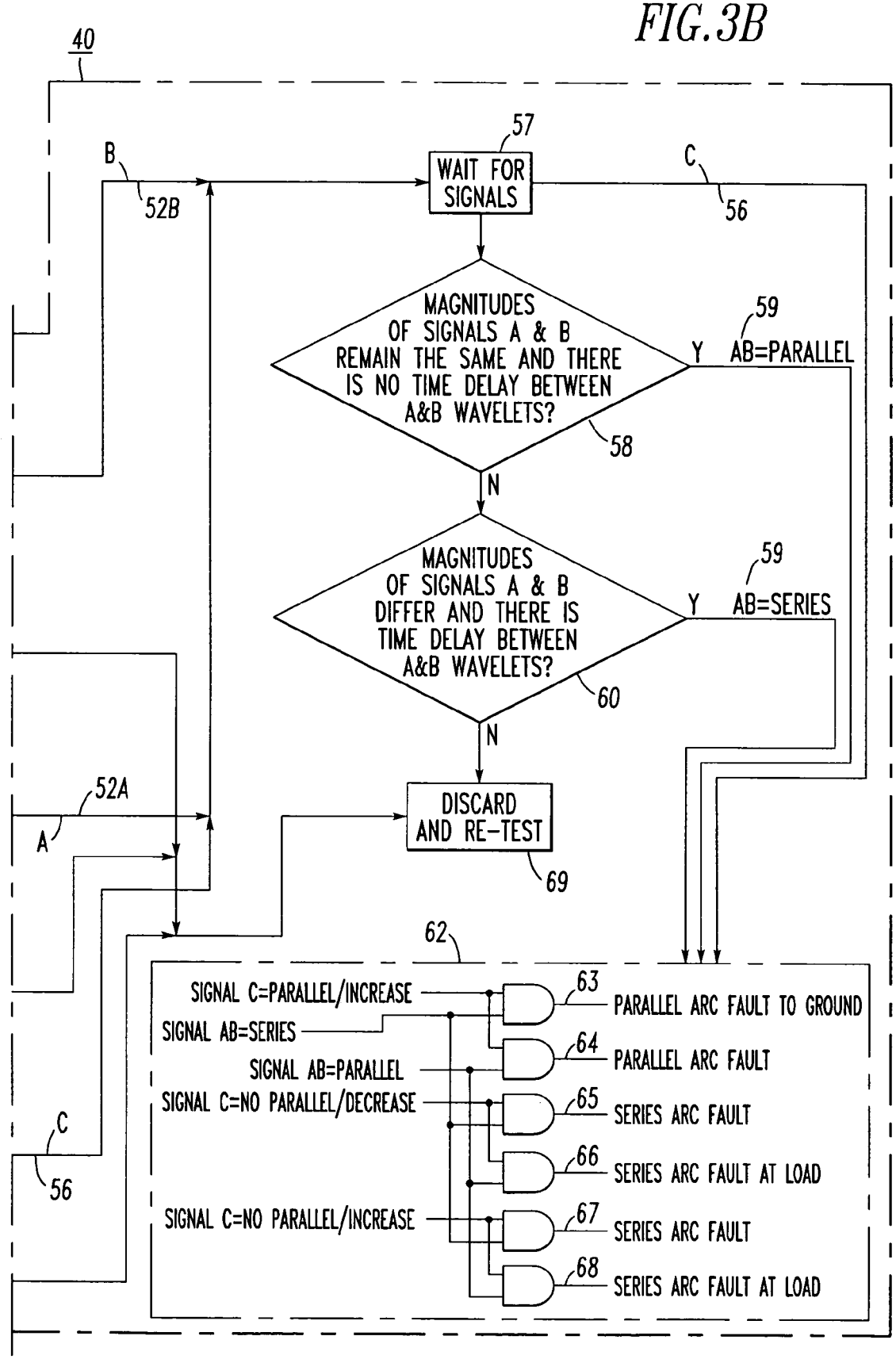

FIGS. 3A-3B form a flowchart of the algorithm 40 suitable for use by the circuit breakers 2,2' of FIGS. 1 and 2 to distinguish between the series and parallel arc fault conditions 6,6'. Although the algorithm 40 distinguishes whether the series arc fault condition 6, or the parallel arc fault condition 6' or neither of these arc fault conditions is present, it will be appreciated that one corresponding algorithm may determine a series arc fault condition and that another corresponding algorithm may determine a parallel arc fault condition.

The output 41A of the first acoustic sensor (AS) 4A is buffered by a buffer 42A and is, then, input by an acoustic band pass filter 44A. Similarly, the output 41B of the second acoustic sensor (AS) 4B is buffered by a buffer 42B and is, then, input by an acoustic band pass filter 44B. The signals of the outputs 41A,41B have magnitudes (e.g., without limitation, over several cycles) at the actual current signal frequency and its harmonics and sub-harmonics. The output 45 of the current sensor 32 has the sensed current signal 33. This signal is buffered by a buffer 46 and is, then, input by a current signal filter 48. The output 49A of the acoustic band pass filter 44A is analyzed, at 50A, to determine if an acoustic signal at one or more predetermined frequencies is detected. If so, then a signal A 52A is asserted. Similarly, the output 49B of the acoustic band pass filter 44B is analyzed, at 50B, to determine if an acoustic signal at one or more predetermined frequencies is detected. If so, then a signal B 52B is asserted. The output 53 of the current signal filter 48 is analyzed, at 54, by conventional arc fault detection techniques.

For example, the sensed current signal 33 may be a parallel arcing form as is discussed below in connection with Example 8, or may be a series arcing form as is discussed below in connection with Example 9. Preferably, the current signal filter 48 outputs the current frequency (and, thus, its harmonics and sub-harmonics) to the acoustic band pass filters 44A,44B.

At 54, if the sensed current signal 33 is either a parallel arcing form or is not a parallel arcing form (i.e., no parallel arcing form), then a signal C 56 is output with one of: (1) signal C=parallel/increase; (2) signal C=no parallel/decrease; or (3) signal C=no parallel/increase, as appropriate, wherein "parallel" tentatively indicates a parallel arc fault, "no parallel" tentatively indicates no parallel arc fault, "decrease" is a current step decrease, and "increase" is a current step increase. See, for example, U.S. Patent Application Publication No. 2005/0017731, which is incorporated by reference herein. For example, "no parallel/increase" means that the current-based arc fault detection circuit does not indicate that there is a parallel arc fault, but that the current actually increases. On the other hand, if the signal C 56 is not output, then no arc fault was detected at 54, then the filtered acoustic signals 49A,49B and the sensed current signal 33 are discarded at 69 (FIG. 3B) and, then, are re-sampled for a subsequent test. Similarly, if no arc fault was detected at 58,60 (FIG. 3B), then the filtered acoustic signals 49A,49B and the sensed current signal 33 are similarly discarded at 69 and, then, are re-sampled for a subsequent test.

The signals 52A and 52B, as derived from the sensed acoustic signals at 49A and 49B, respectively, are used to separately determine if there is tentatively a parallel arc fault or a series arc fault. At 57 of FIG. 3B, the signals 52A,52B and 56 and the corresponding filtered acoustic signals 49A,49B (FIG. 3A) are collected. The signals 52A,52B are applied to one or both of two tests at 58,60; the signal 56 is applied at step 62.

At 58, it is determined if the difference between the magnitudes of the signals 49A,49B is less than a predetermined amount (e.g., these magnitudes are about the same) and if the difference between the time of receipt of the signals 49A,49B is less than a predetermined time (e.g., these times are about the same). If so, then this tentatively indicates a parallel arc fault and signal AB 59 is output with signal AB=parallel, wherein "parallel" tentatively indicates a parallel arc fault.

Otherwise, at 60, it is determined if the difference between the magnitudes of the signals 49A,49B is greater than the predetermined amount and if the difference between the time of receipt of the signals 49A,49B is greater than the predetermined time. If so, then this tentatively indicates a series arc fault and signal AB 59 is output with signal AB=series, wherein "series" tentatively indicates a series arc fault.

Next, step 62 examines signal C 56 and signal AB 59 and displays one of the following types of arc fault as shown by Table 1.

TABLE 1

| Signal C | Signal AB | Type of Arc Fault |
|---|---|---|
| parallel/increase | series | parallel arc fault to ground 63 |
| parallel/increase | parallel | parallel arc fault 64 |
| no parallel/decrease | series | series arc fault 65 |
| no parallel/decrease | parallel | series arc fault at load (e.g., at outlet) 66 |
| no parallel/increase | series | series arc fault 67 |
| no parallel/increase | parallel | series arc fault at load (e.g., at outlet) 68 |

EXAMPLE 7

For the parallel arc fault condition 6' (FIGS. 2 and 3A-3B), the signal magnitude difference and the time delay depend upon the attenuation rate of the acoustic signals 12A',12B' (FIG. 2) and the traveling speed or propagation velocity. For example, if the distance difference is 1 foot, then the acoustic signal magnitude difference is about 0.4 db with an example 12 AWG conductor (e.g., an example acoustic attenuation rate of 20 db/50 feet translates into about a 5% difference between the acoustic signal magnitudes). In this example, the time delay or travel time difference is about 0.1 mS (e.g., an example acoustic traveling speed is about 10 feet/mS for a 12 AWG wire). Hence, for the parallel arc fault condition 6', the two signal magnitudes of the acoustic signals 12A',12B' have a difference of less than about 5% and a time delay difference of less than about 0.1 mS.

EXAMPLE 8

In addition to Example 7, another signal which can help to confirm the determination of the parallel arc fault condition 6' is the sensed current signal 33. The current will increase in the event of a parallel arc fault. Furthermore, the circuit 20 preferably includes a suitable arc fault detection circuit (not shown), which, as is well known, uses the sensed current signal 33 to detect the parallel arc fault.

EXAMPLE 9

In contrast, for the series arc fault condition 6 (FIGS. 1 and 3A-3B), the difference between the magnitudes of the first and second sensed acoustic signals 12A,12B most likely is greater than about 5% of the larger of those magnitudes and the time delay difference is expected to be greater than about 0.1 mS. Again, the sensed current signal 33 will decrease in this case.

EXAMPLE 10

If the series arc fault condition 6 is located at a downstream receptacle (not shown) or at the load side, then it is possible that the difference between the magnitudes of the acoustic signals 49A,49B is less than the predetermined amount and the difference between the time receipt of the signals 49A, 49B is less than the predetermined time. In order to distinguish the series arc fault condition 6 from the parallel arc fault condition 6', the sensed current signal 33 is examined. If this sensed current signal 33 increases and also indicates a parallel arc fault by the parallel arc fault detection circuit, then the arc fault condition is the parallel arc fault condition 6' (FIG. 2). Otherwise, if the sensed current signal 33 decreases, then the arc fault condition is the series arc fault condition 6 (FIG. 1).

The sensed current signal 33, alone, is not adequate or reliable to detect and distinguish a parallel arc from a series arc. The acoustic sensors 4A,4B detect the arc fault, and whether it is a series arc or a parallel arc. The sensed current signal 33 is employed for further confirmation.

In this example, if there is a series arc fault just outside the load or at a load terminal of the load, the time and magnitude differences of the acoustic signals 49A,49B may be relatively small. However, the sensed current signal 33 will see a step-down change, which does not provide a parallel arc fault indication. Hence, the arc fault should be identified as a series arc fault at a load (e.g., wiring device; outlet).

EXAMPLE 11

Even though Examples 7 and 9, above, are for distinguishing the parallel and series arc fault conditions 6',6, respectively, for an alternating current (AC) power circuit, the same principle can be applied to a direct current (DC) power circuit with the acoustic sensors 14A,14B being located at both the line and neutral upon the detection of an arc fault. For the direct current example, it is first determined if it is a direct current arc fault condition (e.g., U.S. patent application Ser. No. 11/034,425, filed Jan. 12, 2005, discloses a band pass filter at 12.5 kHz, 25 kHz or 50 kHz for an acoustic sensor and a circuit which determines if a relatively low level noise persists for greater than a suitable time period (e.g., 0.1 S), during which time the sensed current remains unchanged). Then, the same approach, as above, is applied. Thus, the strategy for DC arc fault detection utilizes noise levels in certain frequency regimes and is based on the steady persistence of acoustic activity. Also, in order to generate the trip signal 24, the sensed current signal 33 essentially remains in the arcing state. Here, this is determined by the sensed current signal 33 being an arcing form when the step change of the current noise signal exceeds a predetermined level at a predetermined frequency band.

EXAMPLE 12

In this example, there is a parallel arc fault from the load conductor 8 to ground, rather than from the load conductor 8 to the load-neutral conductor 9. Here, there is a significant acoustic signal in connection with the load conductor 8, and either no acoustic signal or no significant acoustic signal in connection with the load-neutral conductor 9, even though there is a parallel arc fault. Again, in this example, the acoustic signals 49A,49B will detect an arc fault and preliminarily determine, incorrectly, that it is a series arc fault, since the time and magnitude differences between the acoustic signals 49A,49B exceed the predetermined values. For example, if there is no acoustic signal on the load-neutral conductor 9 a predetermined time (e.g., without limitation, 10 ms) after the arrival time of the acoustic signal from the load conductor 8, then the corresponding arrival time is assumed to be the predetermined time, and the corresponding magnitude is assumed to be zero. In turn, the current step change/parallel arc indication provides an opposite (which means that both the increase step change in current and parallel arc fault indication based on current are confirmed) indication that the arc fault is, in fact, a parallel arc fault. This result may be used to indicate that there was a parallel arc fault to ground.

EXAMPLE 13

In this example, there is a series arc fault in the load conductor 8 of a power circuit in which the load is relatively far away. Hence, the acoustic signal 49B from the load-neutral conductor 9 might be relatively weak or might be attenuated to about zero, while the acoustic signal 49A from the load conductor 8 arrives earlier and has a relatively larger magnitude than the arrival time and magnitude, respectively, of the acoustic signal 49B. Again, for example, if there is no acoustic signal on the load-neutral conductor 9 a predetermined time (e.g., without limitation, 10 ms) after the arrival time of the acoustic signal 49A from the load conductor 8, then the corresponding arrival time is assumed to be the predetermined time, and the corresponding magnitude is assumed to be zero. Thus, the differences in both the arrival times and the magnitudes of the acoustic signals 49A,49B indicate a series arc fault, which is confirmed by the step reduction in the sensed current signal 33 and no parallel arc fault indication based on current associated with the series arc fault.

EXAMPLE 14

Further to Example 10, the example circuit breakers 2,2' can detect, for example, a loose and arcing screw at a wiring device (e.g., a receptacle), an arc at the plug/receptacle junction or an arc in the load itself. If the time difference between the acoustic signals 49A,49B is relatively small, then this means that the lengths of the conductors to the fault are about the same distance away from the circuit breaker. If the sensed current signal 33 has a suitable step decrease and there is no parallel arc fault detected, then that means that the fault is a series fault. The only place that the above conditions can happen is at the wiring device. Therefore, something is arcing at or near the wiring device.

Figure 4:
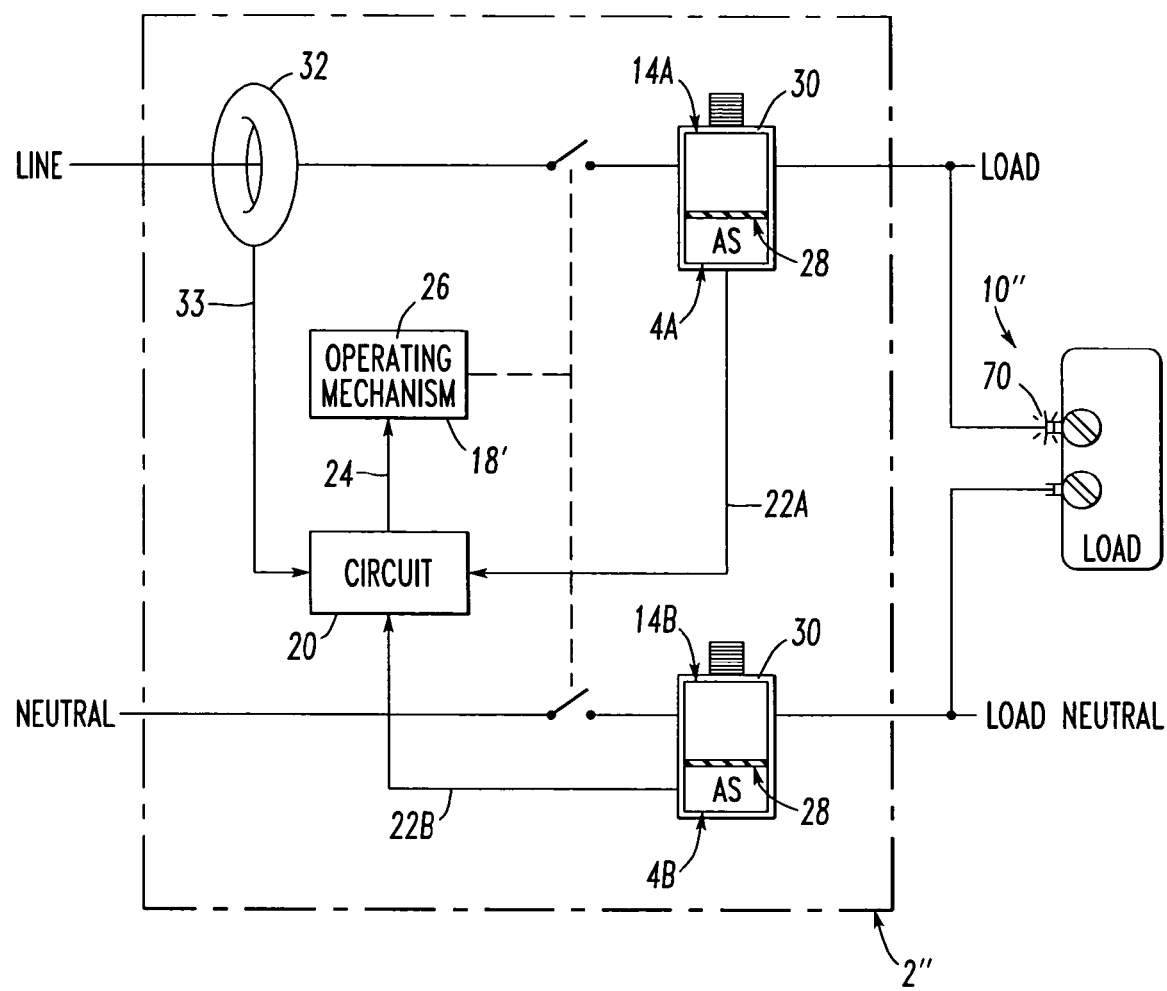
FIG. 4 is a block diagram of a receptacle employing acoustic sensors and a current sensor to detect and distinguish an arc fault in accordance with another embodiment of the invention.

FIG. 4 shows a receptacle 2" including an operating mechanism 18', the acoustic sensors 4A,4B, the current sensor 32 and the circuit 20 employing the algorithm 40 (FIGS. 3A-3B) to detect an arc fault 70 of a power circuit 10".

It will be appreciated that the circuit 20 and the algorithm 40 disclosed herein may be implemented by analog, digital and/or processor-based circuits.

While for clarity of disclosure reference has been made herein to the exemplary display 38 for displaying a series arc fault condition and/or a parallel arc fault condition, it will be appreciated that such conditions may be stored, printed on hard copy, be computer modified, or be combined with other data. All such processing shall be deemed to fall within the terms "display" or "displaying" as employed herein.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An electrical switching apparatus for detecting and distinguishing a fault of a power circuit, said electrical switching apparatus comprising:
    a first lug;
    a second acoustic lug structured to be electrically connected to said power circuit;
    a third acoustic lug structured to be electrically connected to said power circuit;
    separable contacts electrically connected in series between said first lug and said second acoustic lug;
    an operating mechanism structured to open and close said separable contacts;
    a first acoustic sensor coupled to said second acoustic lug, said first acoustic sensor being structured to sense a first acoustic signal from said second acoustic lug, said first acoustic signal being operatively associated with the fault of said power circuit;
    a second acoustic sensor coupled to said third acoustic lug, said second acoustic sensor being structured to sense a second acoustic signal from said third acoustic lug, said second acoustic signal being operatively associated with the fault of said power circuit;
    a third current sensor structured to sense a current flowing between said first lug and said second acoustic lug; and
    a circuit inputting said first and second sensed acoustic signals and said sensed current, said circuit structured to detect and distinguish a parallel arc fault or a series arc fault from said first and second sensed acoustic signals and said sensed current.

2. The electrical switching apparatus of claim 1 wherein each of said sensed current and said first and second sensed acoustic signals has a magnitude; wherein each of said first and second sensed acoustic signals has a time of receipt by said circuit; and wherein said circuit is further structured to determine if the difference between the magnitudes of said first and second sensed acoustic signals is greater than a predetermined amount or if the difference between the time of receipt of said first and second sensed acoustic signals is greater than a predetermined time, and if the magnitude of said sensed current confirms said fault to be a series arc fault.

3. The electrical switching apparatus of claim 2 wherein said circuit comprises a display structured to display said series arc fault.

4. The electrical switching apparatus of claim 2 wherein said circuit is further structured to indicate if the magnitude of said sensed current indicates either said parallel arc fault or said series arc fault.

5. The electrical switching apparatus of claim 2 wherein, for said series arc fault, the difference between the magnitudes of said first and second sensed acoustic signals is greater than about 5% of one of said magnitudes.

6. The electrical switching apparatus of claim 2 wherein said predetermined time is about 0.1 mS.

7. The electrical switching apparatus of claim 1 wherein each of said sensed current and said first and second sensed acoustic signals has a magnitude; wherein each of said first and second sensed acoustic signals has a time of receipt by said circuit; and wherein said circuit is further structured to determine if the difference between the magnitudes of said first and second sensed acoustic signals is less than a predetermined amount or if the difference between the time of receipt of said first and second sensed acoustic signals is less than a predetermined time, and if the magnitude of said sensed current confirms said fault to be a parallel arc fault.

8. The electrical switching apparatus of claim 7 wherein said circuit comprises a display structured to display said parallel arc fault.

9. The electrical switching apparatus of claim 7 wherein said circuit is further structured to indicate if the magnitude of said sensed current indicates either said parallel arc fault or said series arc fault.

10. The electrical switching apparatus of claim 7 wherein, for said parallel arc fault, the difference between the magnitudes of said first and second sensed acoustic signals is less than about 5% of one of said magnitudes.

11. The electrical switching apparatus of claim 7 wherein said predetermined time is about 0.1 mS.

12. The electrical switching apparatus of claim 1 wherein said power circuit includes a load conductor and a load-neutral conductor; wherein said second acoustic lug is structured to be electrically connected to said load conductor; and wherein said third acoustic lug is structured to be electrically connected to said load-neutral conductor.

13. The electrical switching apparatus of claim 1 wherein said second acoustic lug includes a voltage adapted to be electrically output to said power circuit; and wherein said second acoustic lug comprises an electrical insulator structured to electrically insulate said second acoustic sensor from said voltage.

14. The electrical switching apparatus of claim 1 wherein each of said second and third acoustic lugs comprises an acoustic insulator structured to insulate the corresponding one of said first and second acoustic sensors from airborne noise.

15. The electrical switching apparatus of claim 1 wherein said first and second acoustic sensors are piezo electrical sensors.

16. The electrical switching apparatus of claim 1 wherein said electrical switching apparatus is a receptacle.

17. A method of distinguishing a fault in a power circuit, said method comprising:
    employing a first acoustic lug structured to be electrically connected to said power circuit;
    employing a second acoustic lug structured to be electrically connected to said power circuit;
    coupling a first acoustic sensor to said first acoustic lug;
    coupling a second acoustic sensor to said second acoustic lug;
    sensing a first acoustic signal from said first acoustic lug with said first acoustic sensor, said first acoustic signal being operatively associated with the fault of said power circuit;
    sensing a second acoustic signal from said second acoustic lug with said second acoustic sensor, said second acoustic signal being operatively associated with the fault of said power circuit;
    sensing a current flowing between said first acoustic lug and said power circuit;
    inputting said first and second sensed acoustic signals and said sensed current and distinguishing a parallel arc fault or a series arc fault from said first and second sensed acoustic signals and said sensed current.

18. The method of claim 17 further comprising
    employing as said power circuit a direct current power circuit; and
    distinguishing said fault in said direct current power circuit.

19. The method of claim 17 further comprising inputting one of said first and second sensed acoustic signals to a band pass filter;

outputting a filtered signal from said band pass filter; and analyzing said filtered signal to detect an acoustic signal at about a predetermined frequency.

20. The method of claim 17 further comprising employing as said power circuit an alternating current power circuit; and distinguishing said fault in said alternating current power circuit.

21. The method of claim 17 further comprising determining a parallel arc fault from said sensed current;

determining a step increase in said sensed current;

determining a series arc fault from said first and second sensed acoustic signals; and displaying a parallel arc fault to ground condition.

22. The method of claim 17 further comprising determining a parallel arc fault from said sensed current;

determining a step increase in said sensed current;

determining a parallel arc fault from said first and second sensed acoustic signals; and displaying a parallel arc fault condition.

23. The method of claim 17 further comprising determining no parallel arc fault from said sensed current;

determining a step decrease in said sensed current;

determining a series arc fault from said first and second sensed acoustic signals; and displaying a series arc fault condition.

24. The method of claim 17 further comprising determining no parallel arc fault from said sensed current;

determining a step decrease in said sensed current;

determining a parallel arc fault from said first and second sensed acoustic signals; and displaying a series arc fault at a load condition.

25. The method of claim 17 further comprising determining no parallel arc fault from said sensed current;

determining a step increase in said sensed current;

determining a series arc fault from said first and second sensed acoustic signals; and displaying a series arc fault condition.

26. The method of claim 17 further comprising determining no parallel arc fault from said sensed current;

determining a step increase in said sensed current;

determining a parallel arc fault from said first and second sensed acoustic signals; and displaying a series arc fault at a load condition.

* * * * *